(12) United States Patent
Williams et al.

(10) Patent No.: US 10,686,455 B1
(45) Date of Patent: Jun. 16, 2020

(54) DIGITAL HIGH SPEED ACQUISITION SYSTEM FOR PHASE LOCKED LOOPS

(71) Applicant: Teledyne Defense Electronics, LLC, Thousand Oaks, CA (US)

(72) Inventors: Anthony David Williams, Aptos, CA (US); Gursewak Singh Rai, Morgan Hill, CA (US); Vincent Lee, Los Altos, CA (US)

(73) Assignee: TELEDYNE DEFENSE ELECTRONICS, LLC, Thousand Oaks, CA (US)

( * ) Notice: Subject to any disclaimer, the term of this patent is extended or adjusted under 35 U.S.C. 154(b) by 0 days.

(21) Appl. No.: 16/540,577

(22) Filed: Aug. 14, 2019

(51) Int. Cl.
| | |
|---|---|
| *H03L 7/099* | (2006.01) |
| *H03K 5/003* | (2006.01) |
| *H03K 5/24* | (2006.01) |
| *H03M 1/12* | (2006.01) |

(52) U.S. Cl.
CPC ............ *H03L 7/099* (2013.01); *H03K 5/003* (2013.01); *H03K 5/24* (2013.01); *H03M 1/12* (2013.01)

(58) Field of Classification Search
CPC .......... H03L 7/099; H03K 5/003; H03K 5/24; H03M 1/12
See application file for complete search history.

(56) References Cited

U.S. PATENT DOCUMENTS

| | | | |
|---|---|---|---|
| 3,755,758 A | 8/1973 | Leeson | |
| 4,935,706 A | 6/1990 | Schenberg | |
| 5,206,726 A * | 4/1993 | Okuda | H04N 9/896 348/497 |
| 5,334,952 A | 8/1994 | Maddy et al. | |
| 6,960,947 B2 | 11/2005 | Albasini et al. | |
| 7,038,507 B2 | 5/2006 | Williams | |
| 7,656,236 B2 | 2/2010 | Williams | |
| 7,961,833 B2 | 6/2011 | Albasini et al. | |
| 10,141,943 B1 * | 11/2018 | Williams | H03L 7/1075 |

OTHER PUBLICATIONS

Gardner, Floyd M., Phaselock Techniques, Wiley & Sons. Inc., 1966, pp. 197-199.
Elliot, Rod, Using Current Sources, Sinks & Mirrors in Audio, Jan. 6, 2012, 19 pages.

(Continued)

*Primary Examiner* — Dinh T Le
(74) *Attorney, Agent, or Firm* — K&L Gates LLP (57) ABSTRACT

Disclosed is a signal generator that includes a memory to store tuning voltage values and offset voltage values. An adder/subtractor circuit is coupled to the memory to produce a sum and a difference of the tuning and offset voltages. A comparator circuit is coupled to the adder/subtractor circuit to receive a digitized voltage controlled oscillator tuning voltage and to compare the digitized voltage controlled oscillator tuning voltage to the sum and difference of the tuning and offset voltages to produce a window bounded by the sum and difference of the tuning and offset voltages. The comparator circuit is further configured to generate control signals. A steering current circuit is coupled to the comparator circuit to receive the control signals from the comparator circuit and to control a steering current based on the control signals.

21 Claims, 6 Drawing Sheets

(56) References Cited

OTHER PUBLICATIONS

7SB384 Bus Switch, ON Semiconductor ©, Semiconductor Components Industries, LLC, Mar. 2011, Rev. 2, 10 pages.
Brennan, Paul V., Phase-Locked Loops, Principles and Practice, McGraw Hill, 1996, pp. 90-92.
Clayton, George and Steve Winder, Operational Amplifiers, Newnes, 4th ed., 2000, pp. 144-145.
Helszajn, J., YIG Resonators and Filters, John Wiley & Sons, 1985, pp. 191-201.
Manassewitsch, Vadim, Frequency Synthesizers, Voltage-Controlled Oscillator Tuning Circuits, John Wiley & Sons, 1980, pp. 431-436.
Manassewitsch, Vadim, Frequency Synthesizers, Theory and Design, John Wiley & Sons, 1980, pp. 438-511.
Gorski-Popiel et al., Frequency Synthesis: Techniques and Applications, IEEE Press, 1975, pp. 69-149.

* cited by examiner

DIGITAL HIGH SPEED ACQUISITION SYSTEM FOR PHASE LOCKED LOOPS

BACKGROUND

The present disclosure is directed generally to a frequency synthesizer. A high speed acquisition system for phase locked loops to reduce component count and improve performance over a wide temperature range is disclosed in commonly owned U.S. Pat. No. 10,141,943, which is herein incorporated by reference in its entirety. The disclosed phase locked loop (PLL) has a low value of loop bandwidth and consequently low phase noise at large offsets from the carrier and may be brought into lock in a much shorter time than that normally set by the loop bandwidth. The time taken for a PLL to change frequency is inversely proportional to its loop bandwidth. Although wide loop bandwidth degrades the signal phase noise at large frequency offsets from the carrier, the digital high speed acquisition system for phase locked loops provides high speed tuning in low phase noise microwave PLLs as described hereinbelow.

SUMMARY

In one aspect, the present disclosure provides a signal generator. The signal generator comprising a memory to store tuning voltage ($V_m$) values and offset voltage ($V_o$) values; an adder circuit coupled to the memory, the adder circuit to produce a sum of a tuning voltage and an offset voltage ($V_m+V_o$); a subtractor circuit coupled to the memory, the subtractor circuit to produce a difference of the tuning voltage and the offset voltage ($V_m-V_o$); a comparator circuit coupled to the adder and the subtractor circuits, the comparator circuit configured to receive a digitized voltage controlled oscillator tuning voltage ($V_t$) and to compare the digitized voltage controlled oscillator (VCO) tuning voltage ($V_t$) to the sum of the tuning voltage and the offset voltage ($V_m+V_o$) and the difference of the tuning voltage and the offset voltage ($V_m-V_o$) and to produce a window bounded by ($V_m+V_o$) and ($V_m-V_o$), the comparator circuit further configured to generate control signals; and a steering current circuit coupled to the comparator circuit to receive the control signals from the comparator circuit and to control a steering current based on the control signals.

In another aspect, the present disclosure provides a method of generating a signal. The method comprises receiving, by a processor/logic, a request to output a new frequency; generating, by a phase-lock-loop (PLL) circuit, a new analog tuning voltage corresponding to the new frequency; loading, by the processor/logic into a comparator, a new digital tuning voltage ($V_t$); loading, by the processor/logic from a memory into an adder/subtractor circuit, a new tuning voltage ($V_m$) corresponding to the value of the new frequency; loading, by the processor/logic from the memory into the adder/subtractor circuit, a new offset voltage ($V_o$); computing, by the comparator, logical mathematical decisions based on the new digital tuning voltage ($V_t$), the new tuning voltage ($V_m$), and the new offset voltage ($V_o$); controlling, by a steering current circuit coupled to the comparator, a steering current into or out of the PLL circuit; and generating, by the PLL circuit, a tuning voltage based on the steering current.

In another aspect, the present disclosure provides a signal generator. The signal generator comprising a processor/logic; a memory coupled to the processor/logic, the memory stores digital tuning voltage and offset voltage values; an adder/subtractor circuit coupled to the memory; a comparator coupled to the adder/subtractor circuit; a steering current circuit coupled to the comparator; and a phase-lock-loop (PLL) circuit coupled to the memory and the steering current circuit, the PLL circuit further comprising: a programmable counter; a loop filter comprising a loop filter capacitor, a loop filter coupled to the steering current circuit; a phase comparator/detector circuit; and a voltage controlled oscillator (VCO); wherein the processor/logic is configured to: receive a request to output a new frequency; generate, by a phase-lock-loop (PLL) circuit, a new analog tuning voltage corresponding to the new frequency; load into the comparator a new digital tuning voltage ($V_t$); load from a memory into an adder/subtractor circuit, a new tuning voltage ($V_m$) corresponding to the value of the new frequency; load from the memory into the adder/subtractor circuit a new offset voltage ($V_o$); wherein the comparator is configured to compute logical mathematical decisions based on the new digital tuning voltage ($V_t$), the new tuning voltage ($V_m$), and the new offset voltage ($V_o$); wherein the steering current circuit is configured to control steering current into or out of the PLL circuit; and wherein the PLL circuit is configured to generate a tuning voltage based on the steering current.

FIGURES

The features of various aspects are set forth with particularity in the appended claims. The various aspects, however, both as to organization and methods of operation may best be understood by reference to the following description, taken in conjunction with the accompanying drawings as follows.

DESCRIPTION

Figure 1:
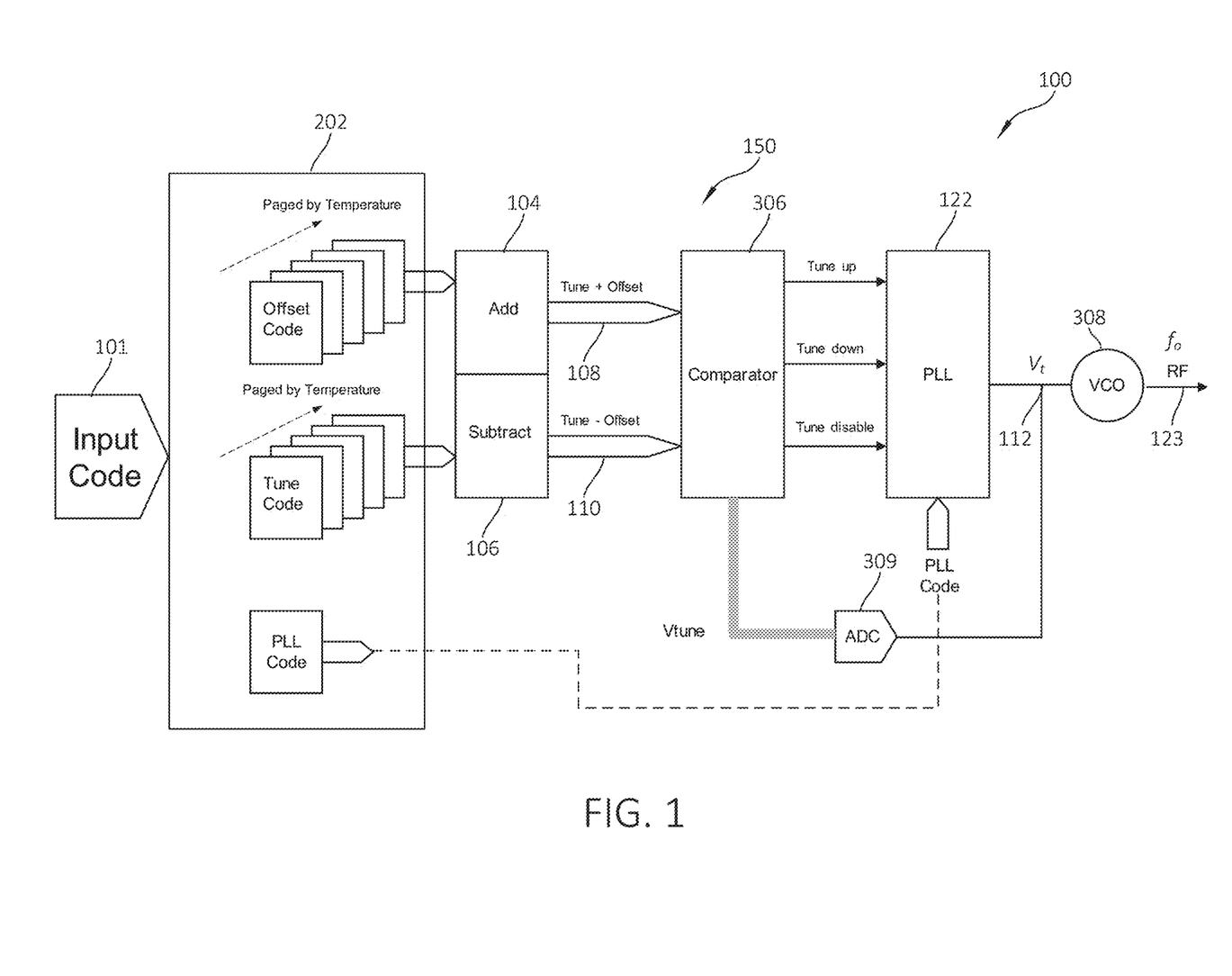
FIG. 1 illustrates a signal generator comprising a frequency synthesizer according to one aspect of the present disclosure.

FIG. 1 illustrates a signal generator 100 comprising a frequency synthesizer 150 according to one aspect of the present disclosure. In various aspects, the frequency synthesizer 150 is a digitally realized high speed acquisition system for a phase locked loop comprising a digitally controlled signal source with a fast switching phase-locked loop circuit 122 (PLL). The PLL circuit 122 is configured to rapidly change frequency while minimizing loop bandwidth, jitter, and phase noise at large offsets from a reference oscillator. In one aspect, the signal generator 100 comprises a voltage controlled oscillator 308 (VCO). The VCO 308 receives a tuning voltage 112 ($V_t$) characterized across the required tuning range with temperature as a parameter. Tuning voltage data is stored in a fast access, non-volatile memory 202 (e.g. MRAM). The tuning voltage data stored in the memory 202 includes frequency tuning codes (also referred to as tuning voltage $V_m$) and frequency offset codes (also referred to as offset voltage $V_o$) paged by temperature and PLL codes. A PLL code is a frequency select digital word that is applied to a programmable N frequency divider of the PLL circuit 122. Input code commands are used to change the output frequency of the signal generator 100. The input codes select digital words stored in the memory 202 that represent the desired output frequency of the signal generator 100. The VCO 308 may be an HMC732LC4B wideband millimeter microwave integrated circuit (MMIC) VCO with buffer amplifier operable from 6-12 GHz available from Analog Devices.

When the PLL circuit 122 is operating and a command to change frequency is received (when the loop division ratio is changed) the tuning voltage 112 ($V_t$) extant at the VCO 308 tuning port is compared to the stored (previously characterized) tuning voltage ($V_m$) value stored in memory 202.

This comparison indicates the direction in which the tuning voltage 112 ($V_t$) must be "steered" in order to reach the stored value corresponding to the target frequency defined by the input code. Frequency offset codes are applied to an adder 104 and frequency tuning codes are applied to a subtractor 106. The output of the adder 104 is the tuning voltage 112 ($V_t$) plus an offset ($V_{Tune}+V_{Offset}$) and the output of the subtractor 106 is the tuning voltage 112 ($V_t$) minus the offset ($V_{Tune}-V_{Offset}$). These outputs are applied to a comparator circuit 306 which tunes up or tunes down the tuning voltage 112 ($V_t$) or disables the tuning voltage 112 ($V_t$) applied to the VCO 308 tuning port. The output of the VCO 308 is the desired RF frequency 123 ($f_o$). The output frequency 123 ($f_o$) is fed back to an analog-to-digital converter 309 (ADC), which provides a digital word ($V_{tune}$) representing the tuning voltage 112 ($V_t$) to the comparator circuit 306.

A PLL circuit 122 loop filter includes an auxiliary charge pump circuit which charges or discharges the primary PLL circuit 122 timing capacitor depending on the required steering direction.

When the VCO 308 tuning voltage 112 ($V_t$) arrives at a value close to that corresponding to the target frequency defined by the input code the auxiliary charge pump is disabled and the PLL circuit 122 locks normally.

The signal generator 100 can be implemented with reduced component count and provides improved performance over a wide temperature range. The signal generator 100 includes a PLL circuit 122 having a low value of loop bandwidth and consequently low phase noise at large offset from the carrier that can be brought into lock in a much shorter time that that normally set by the loop bandwidth. Although wide loop bandwidth tends to degrade the signal phase noise at large frequency offsets from the carrier, the signal generator 100 provides increased tuning speed in a low phase noise microwave PLL circuit 122 as described in more detail hereinbelow.

The comparator circuit 306 is coupled to a steering current circuit 118 and the PLL circuit 122. The comparator circuit 306 compares the digital tuning voltage ($V_{tune}$) received from the ADC 309 to first and second reference threshold voltage values and controls the direction of a steering current into or out of a loop filter capacitor of the PLL circuit 122 based on the value of the digital word ($V_{tune}$) representing the tuning voltage 112 ($V_t$). Charging and discharging the loop filter capacitor with the steering current increases the speed at which the PLL circuit 122 reaches a locked condition after a new output frequency is selected by the input code. The input code may be generated by a user or a machine (e.g., another circuit, processor, logic, etc.) to change the output frequency 123 ($f_o$) to a new specified output frequency 123 ($f_o'$). The comparator circuit 306 may be implemented as a logic circuit and in one aspect, may be implemented as a field programmable gate array (FPGA), for example.

In one aspect, the PLL circuit 122 may be implemented by a LMX2492 500 MHz to 14 GHz wideband, low noise fractional N PLL with ramp/chirp generation, by Texas Instruments Inc. A processor/logic circuit 101 may comprise a general purpose digital processor, controller, microcontroller, discrete logic devices, programmable logic array (PGA), field programmable logic array (FPGA) and/or combinations thereof.

In one aspect, during operation, a processor/logic circuit 101 continuously monitors the PLL circuit 122 lock detect output and for a request to change the output frequency 123 ($f_o$). The request may be initiated manually by a user or may be provided by a machine (e.g., another circuit, processor, logic, PGA, FPGA, etc.). When the processor/logic circuit 101 detects a frequency change request, the processor/logic circuit 101 loads a new frequency input code into the memory 202. The input code is a digital value that is approximately the same value as the digitized form of the tuning voltage 112 ($V_t$) applied to the VCO 308 portion of the PLL circuit 122 to set the output frequency 123 ($f_o$) to a specific desired output frequency 123 ($f_o$).

Figure 2:
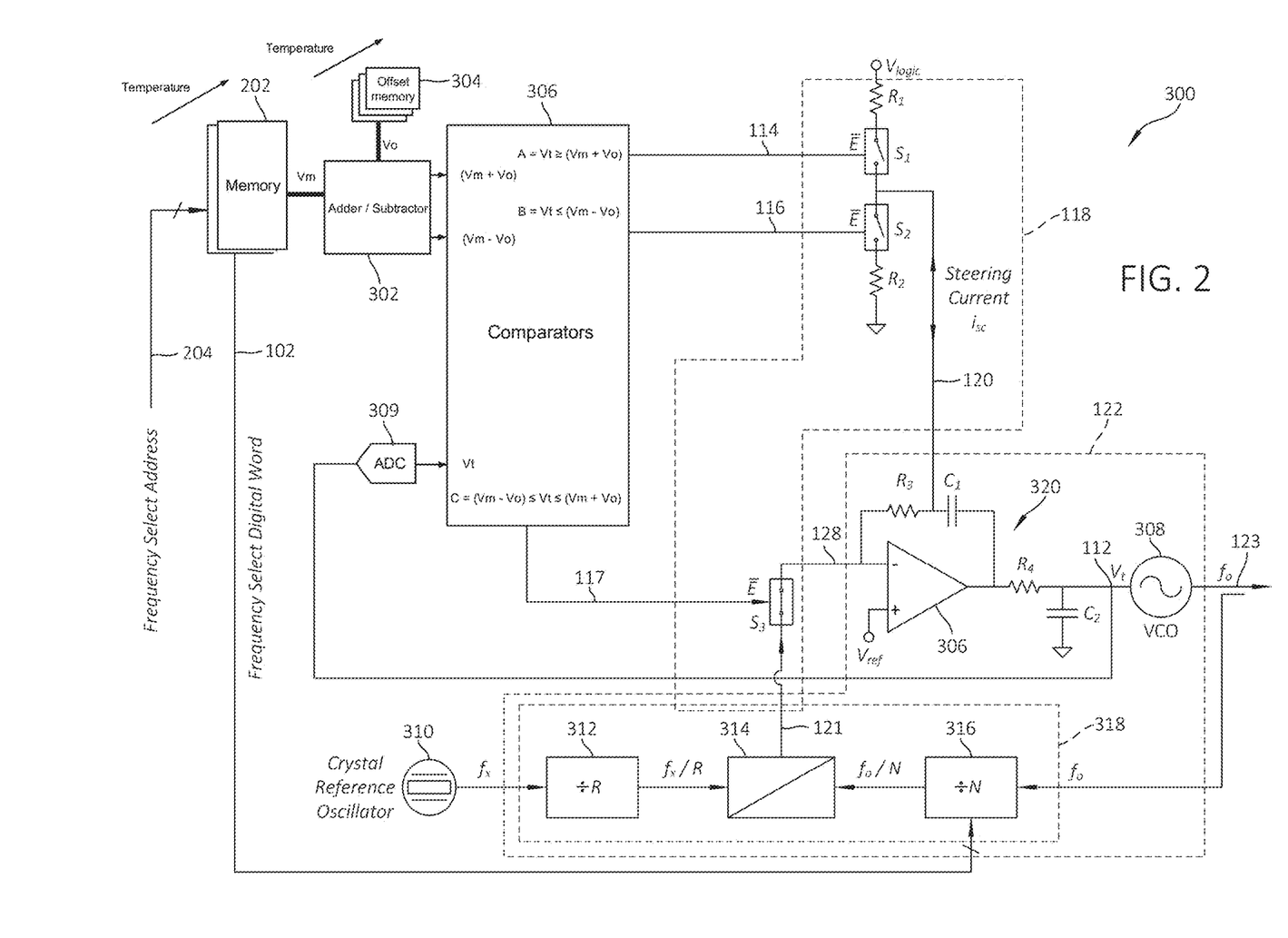
FIG. 2 illustrates a signal generator comprising a frequency synthesizer according to one aspect of the present disclosure.

FIG. 2 illustrates a signal generator 300 comprising a frequency synthesizer according to one aspect of the present disclosure. The signal generator 300 comprises a memory 202 coupled to an adder/subtractor circuit 302, which is coupled to an offset memory 304 and a comparator circuit 306. The comparator circuit 306 is coupled to a current steering current circuit 118, which is coupled to the PLL circuit 122 and a PLL control circuit 318. The memory 202 receives a frequency select address 204 and provides a frequency select digital word 102 to the PLL control circuit 318 and provides the tuning voltage ($V_m$) value stored in the memory 202 and offset voltage ($V_o$) value stored in the offset memory 304 to the adder/subtractor circuit 302.

The PLL circuit 122 comprises a PLL control circuit 318, a loop filter 320 (e.g., an active low pass filter), and a VCO 308. In one aspect, the VCO 308 may be implemented separately with an RFVC1843 5V InGaP MMIC VCO with an integrated frequency divider providing additional $f_o/2$ and $f_o/4$ outputs by RF Micro Devices (RFMD). The VCO 308, which may be any form of electronically tuned oscillator, feeds the signal output port 123 with a signal at some frequency $f_o$. A portion of the output signal 123 ($f_o$) is fed to a programmable N frequency divider 316 whose output frequency will be equal to $f_o/N$. The divider output $f_o/N$ is fed to a phase/frequency detector 314 (PFD) together with a reference signal $f_{ref}$ which may be derived from a reference oscillator 310. The output frequency 123 ($f_o$) of the VCO 308 is the output of the signal generator 300. The reference oscillator 310 may comprise a crystal reference oscillator that generates a reference frequency ($f_x$). The reference frequency ($f_x$) is applied to a fixed counter 312 (R divider circuit). A sample of the output frequency 123 ($f_o$) is applied to the programmable counter 316 (N divider circuit) via a directional coupler or signal splitter. The output of the programmable counter 316 is fed to a phase comparator/detector 314 together with the output of the fixed counter 312, which is a reference signal derived from the reference frequency ($f_x$) generated by the crystal reference oscillator 310. The value of the loop divisor (N) of the programmable counter 316 is controlled by the frequency control word 102. The phase comparator/detector 314 output signal 121 ($f_{ref}$) output in the form of a pulse width modulated waveform at the reference frequency ($f_{ref}$) is fed to the input of the loop filter 320 via a switch S3, which is electronically activated when a control input is driven low (logic 0), as described hereinbelow.

The switch S3 is coupled to the input of an operational amplifier active low pass loop filter 320 to the VCO tuning port thereby closing the PLL circuit 122. The loop filter 320 comprises an operational amplifier circuit 306 with a loop filter capacitor C1 inserted in the feedback loop. A resistor R3 may be provided between the loop filter capacitor C1 and the negative input of the amplifier circuit 306. A passive low pass filter comprising R4 and C2 may be coupled between the output of the amplifier circuit 306 and the VCO 308. The low pass filtered output of the loop filter 320 is the tuning voltage 112 ($V_t$), which is applied to the tuning port of the VCO 308 to produce the output frequency 123 ($f_o$). Provision is made to switch a steering current 120 ($I_{sc}$) into or out of the loop filter capacitor C1 via two high speed, low resistance analog switches S1, S2, as described hereinbelow, to increase the switching speed of the PLL circuit 122. The PLL circuit 122 acts to maintain the output frequency $f_o = N \times f_{ref}$, where $f_{ref} = f_x/R$ The ADC 309 is coupled to the tuning port of the VCO 308 and the tuning voltage 112 ($V_t$) is applied to the input of the ADC 309 and produces a digital output word representing the value of the tuning voltage 112 ($V_t$) extant at the VCO 308 tuning port. 3. A small "offset value" ($V_o$) is both added to and subtracted from the stored value of the tuning voltage ($V_m$) corresponding to the target frequency to produce two digital values ($V_m+V_o$) and ($V_m-V_o$). A digitized version of the tuning voltage 112 ($V_t$) is output by the ADC 309. The digitized value of the tuning voltage 112 ($V_t$) is compared to ($V_m+V_o$) and ($V_m-V_o$) to define a "window" bound by ($V_m+V_o$) and ($V_m-V_o$). The controller digital circuit (e.g., FPGA) of the comparator circuit 306 is configured to compute three logical mathematical decisions as follows:

$A = V_t \geq (V_m + V_o);$ $B = V_t \leq (V_m - V_o);$ and $C = (V_m - V_o) \leq V_t \leq (V_m + V_o).$ Three electronic switches S1, S2, and S3 are controlled by the logic outputs 114, 116, 117 of the comparator circuit 306 based on these decisions. If A=1, S1 is closed and S2 and S3 are open, and the VCO 308 tuning voltage 112 ($V_t$) ramps down. If B=1, S2 is closed and S1 and S3 are open, and the VCO 308 tuning voltage 112 ($V_t$) ramps up. If C=1, S3 is closed and S1 and S2 are open and at this state, the VCO 308 tuning voltage 112 ($V_{t\_base\_d}$) is within a "window" bounded by ($V_m+V_o$) and ($V_m-V_o$). The PLL circuit 122 will close and will force the VCO 308 tuning voltage 112 ($V_t$) to the exact value to that required to generate a "target frequency."

The operation of the steering current circuit 118 is controlled by the logic outputs 114, 116 of the comparator circuit 306 and are used as conditions for controlling the PLL circuit 122. The steering current circuit 118 comprises two high speed, low resistance electronically activated analog switches S1, S2 that are activated when their control input is driven low (logic 0). Only one of the switches S1, S2 may be activated at a given time. For example, when the first logic output 114 is low (logic 0) the first switch S1 is activated (closed) and when the first logic output 114 is high (logic 1) the first switch S1 is deactivated (open). Similarly, when the second logic output 116 is low (logic 0) the second switch S2 is activated (closed) and when the second logic output 116 is high (logic 1) the second switch S2 is deactivated (open). A first resistor R1 is connected in series with the first switch S1 when the first switch S1 is activated to switch a steering current 120 into the loop filter capacitor C1 to charge the loop filter capacitor C1. A second resistor R2 is connected in series with the second switch S2 when the second switch S2 is activated to switch a steering current 120 out of the loop filter capacitor C1 to discharge the loop filter capacitor C1. The magnitude of the charging steering current 120 is set by R1 and the magnitude of the discharging steering current 120 is set by R2. In some aspects, the magnitude of the charging and discharging steering currents 120 may be the same or different depending on the values of the resistors R1 and R2. In one aspect, the analog switches S1 and S2 may be implemented with a 7SB384 Bus Switch advanced high-speed line switch in ultra-small footprint by ON Semiconductor.

A third high speed low resistance electronically activated analog switch S3 is provided to apply the phase comparator/detector signal 121 ($f_{ref}$) to the PLL circuit 122 when activated by a logic 0 at logic output 117. The comparator circuit 306 outputs a logic 0 on logic output 117 when both logic outputs 114, 116 are high (logic 1). A logic 0 on logic output 117 activates (closes) the third switch S3 to apply the phase comparator/detector signal 121 ($f_{ref}$) to the input of the loop filter 320. It will be appreciated that when both logic outputs 114, 116 are high (logic 1) both switches S1 and S2 are deactivated (open) and at this state, the VCO 308 tuning voltage 112 ($V_t$) is within the "window" bounded by ($V_m+V_o$) and ($V_m-V_o$). When both the first and second switches S1, S2 are deactivated (open), the switches S1 and S2 decouple the steering current 120 from the loop filter capacitor C1 such that no steering current 120 flows into or out of the loop filter capacitor C1. The third switch S3, on the other hand, is activated (closed) to couple the phase comparator/detector signal 121 ($f_{ref}$) to the input of the loop filter 320.

TABLE 1 is a truth table summarizing the operation of the window comparator 110 and the steering current circuit 118.

TABLE 1

| A | B | C | Description |
|---|---|---|---|
| 0 | 1 | 1 | Tuning voltage 112 $V_t \geq (V_m + V_o)$; S1 closed; S2 and S3 open; steering current 120 charges the loop filter capacitor C1 |
| 1 | 0 | 1 | Tuning voltage 112 $V_t \leq (V_m - V_o)$; S2 closed; S1 and S3 open; steering current 120 discharges the loop filter capacitor C1 |
| 1 | 1 | 0 | Tuning voltage 112 $V_t$ remains between "window" bounded by ($V_m + V_o$) and ($V_m - V_o$); S1 and S2 open; S3 closed; no steering current 120 flows; |

TABLE 1-continued

| A | B | C | Description |
|---|---|---|---|
|   |   |   | phase comparator/detector signal 121 coupled to the PLL circuit 122 |

Under steady state conditions the PLL circuit 122 will be locked and the output frequency 123 ($f_o$) is expressed as:

$$f_o = N \times \frac{f_x}{R} = N \times f_{ref} \quad \text{Eq. 1}$$

where N is the divisor of the programmable counter 316, as controlled by the frequency control word 102, and R is the divisor of the fixed counter 312.

The PLL circuit 122 VCO 308 is characterized over the required operating frequency range over temperature. A table of frequency versus tuning voltage ($V_m$) is created in the electronic digital memory 202, which may be a random access memory (RAM), an in one aspect may be a magneto-resistive random-access memory (MRAM).

During operation, when the PLL circuit 122 is commanded to a new frequency, the following process will be executed:

1. The PLL circuit 122 N programmable counter 316 is programmed to the new "target frequency."
2. The PLL circuit 122 will unlock.
3. A small "offset value" ($V_o$) is both added to and subtracted from the stored value of tuning voltage $V_m$ corresponding to the target frequency to produce two digital values ($V_m+V_o$) and ($V_m-V_o$).
4. The digital value output by the ADC ($V_t$) is compared to ($V_m+V_o$) and ($V_m-V_o$).
5. Three mathematical decisions are made in the controller FPGA of the comparator circuit 306: logically $A=V_t \geq (V_m+V_o)$, $B=V_t \leq (V_m-V_o)$ and $C=(V_m-V_o) \leq V_t \leq (V_m+V_o)$.
6. Three electronic switches S1, S2, S3 are controlled by these decisions. If A=1 S1 is closed, S2 and S3 are open, the VCO 308 tuning voltage 112 ($V_t$) ramps down. If B=1 S2 is closed, S1 and S3 are open, the VCO 308 tuning voltage 112 ($V_t$) ramps up.
7. If C=1 S3 is closed, S1 and S2 are open; this state indicates that the VCO 308 tuning voltage 112 ($V_t$) is within the "window" bounded by ($V_m+V_o$) and ($V_m-V_o$). The PLL circuit 122 will close and will force the VCO 308 tuning voltage 112 ($V_t$) to the exact value that is required to generate the "target frequency."
8. The PLL circuit 122 will lock.

Figure 3:
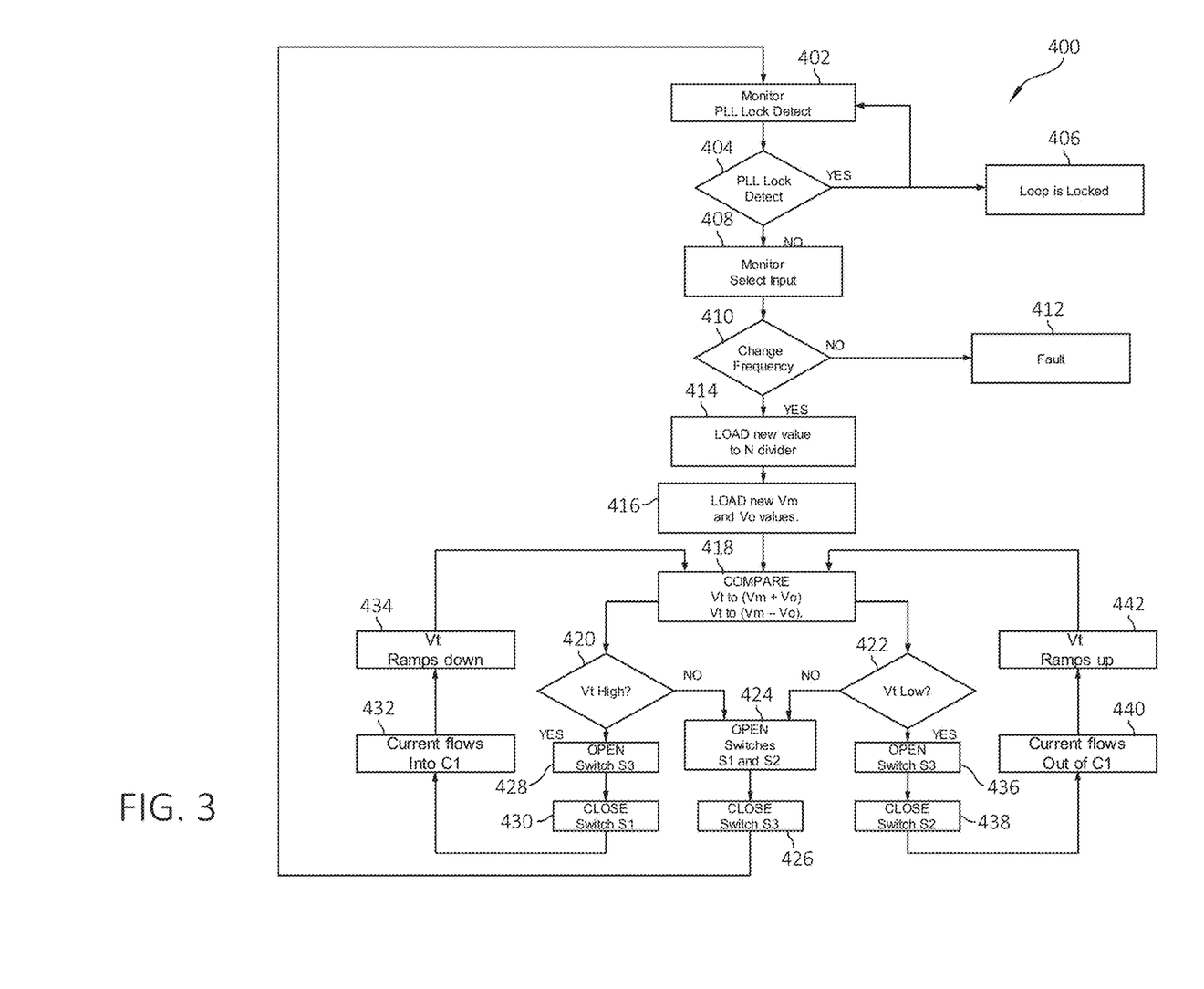
FIG. 3 illustrates a logic flow diagram for operating the signal generator comprising a frequency synthesizer described in FIGS. 1 and 2 according to one aspect of the present disclosure.

FIG. 3 is a logic flow diagram 400 for operating the signal generator comprising a frequency synthesizer described in FIGS. 1 and 2 according to one aspect of the present disclosure. The logic flow diagram 400 will be described in combination with the hardware circuits described in FIGS. 1 and 2. Accordingly, with reference now to FIGS. 1-3, the processor/logic circuit 101 monitors 402 the status of the PLL circuit 122 lock detect. When the processor/logic circuit 101 determines 404 that the PLL circuit 122 is locked 406, the processor/logic circuit 101 continues to monitor 402 the status of the PLL circuit 122 lock detect.

When the processor/logic circuit 101 determines 404 that the PLL circuit 122 is not locked, the processor/logic circuit 101 monitors 408 the select input and determines 410 if a change frequency is requested. If not, the processor/logic circuit 101 registers 412 a fault. If a change frequency is requested, the processor/logic circuit 101 loads 414 a new value to the programmable N frequency divider 316. The processor/logic circuit 101 loads 416 a new tuning voltage $V_m$ from the memory 304 and offset voltage $V_o$ from the offset memory 304 into the adder/subtractor circuit 302 to determine the ($V_m+V_o$) and ($V_m-V_o$) values. The comparator circuit 306 compares 418 the tuning voltage $V_t$ to ($V_m+V_o$) and to ($V_m-V_o$) determines 420 whether $V_t$ is high and determines 422 whether $V_t$ is low.

Figure 4:
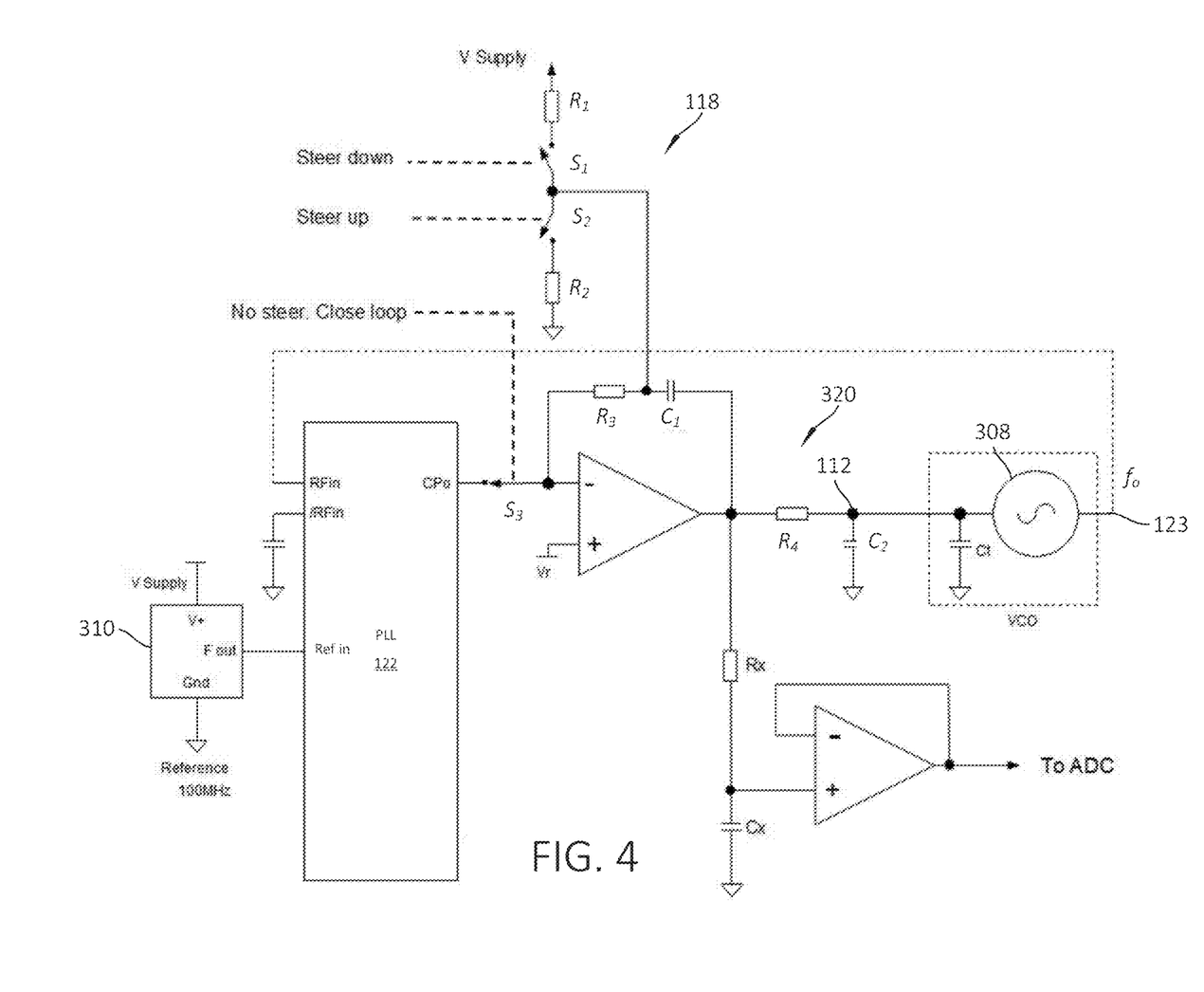
FIG. 4 illustrates the operation of the steering current circuit based on the comparison of the actual tuning voltage ($V_t$) and the desired tuning voltage ($V_m$) when the actual tuning voltage ($V_t$) is within a "window" bounded by ($V_m+V_o$) and ($V_m-V_o$) according to one aspect of the present disclosure.

If $V_t$ is neither high nor low, then $V_t$ is within the "window" bounded by ($V_m+V_o$) and ($V_m-V_o$), the comparator circuit 306 opens 424 switches S1 and S2 and closes 426 switch S3 as shown in FIG. 4 and continues to monitor 402 the PLL circuit 122 lock detect until the PLL circuit 122 lock detect indicates that the PLL circuit 122 is unlocked.

Figure 5:
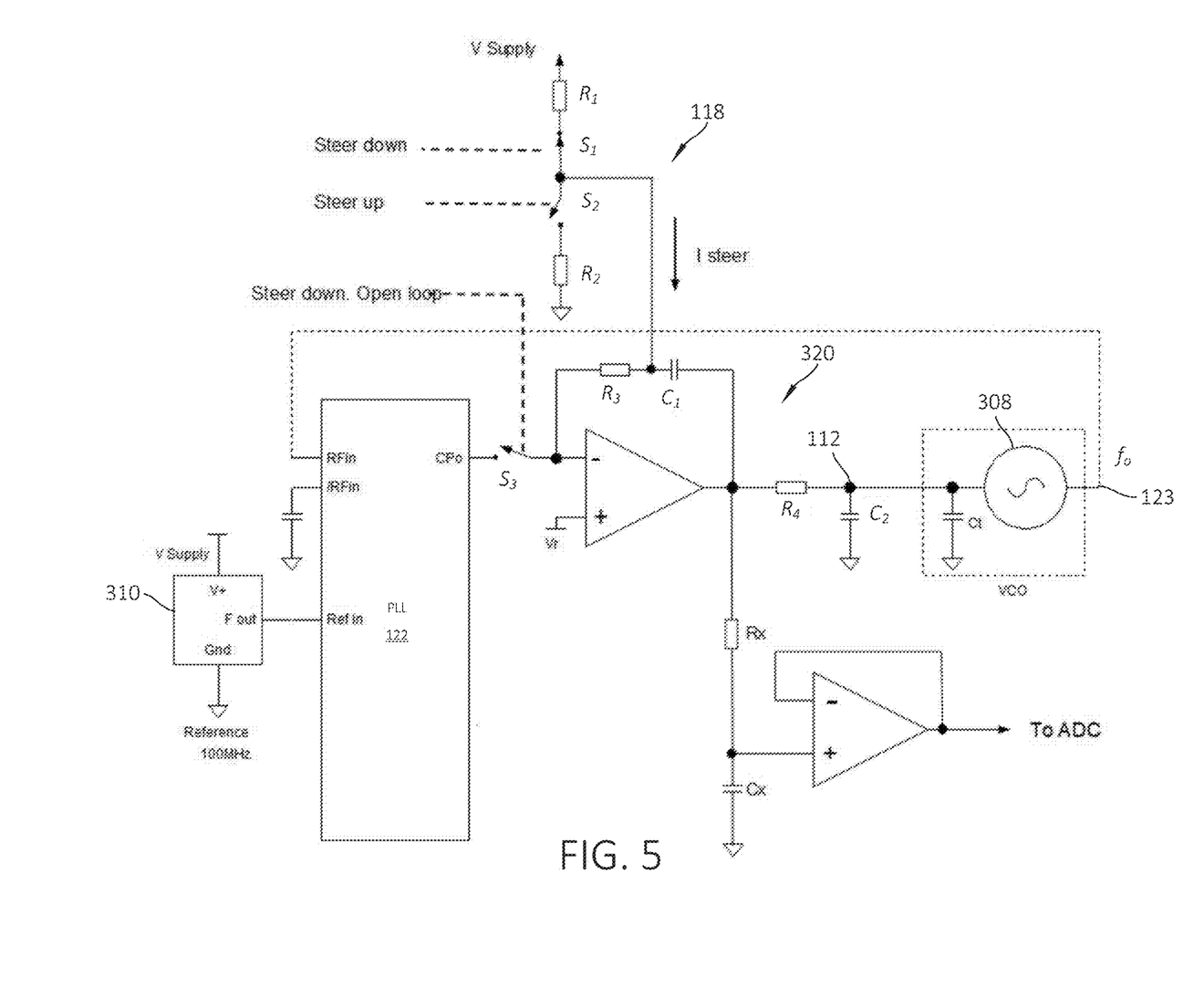
FIG. 5 illustrates the operation of the steering current circuit based on the comparison of the actual tuning voltage ($V_t$) and the desired tuning voltage ($V_m$) when the actual tuning voltage ($V_t$) is high and the processor/logic circuit opens switch S3 and closes switch S1 to enable current to flow into C1 and ramps down the actual tuning voltage ($V_t$).

If $V_t$ is determined 420 to be high, the processor/logic circuit 101 opens 428 switch S3 and closes switch S1, as shown in FIG. 5, to enable current to flow into 432 C1 and ramps down 434 the tuning voltage $V_t$. The processor/logic circuit 101 continues to compare 418 the tuning voltage $V_t$ to ($V_m+V_o$) and to ($V_m-V_o$).

Figure 6:
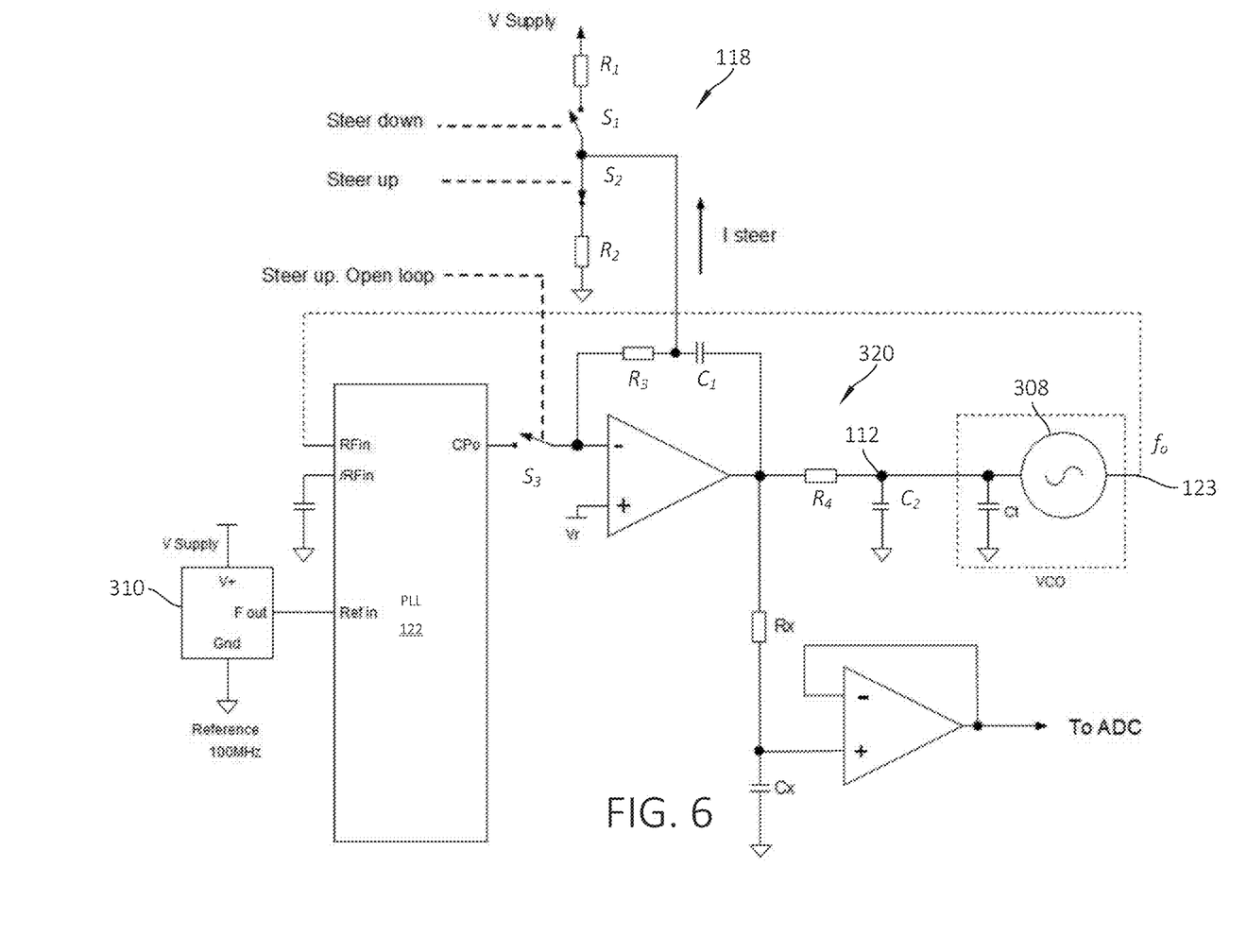
FIG. 6 illustrates the operation of the steering current circuit based on the comparison of the actual tuning voltage ($V_t$) and the desired tuning voltage ($V_m$) when the actual tuning voltage ($V_t$) is low and the processor/logic circuit opens switch S3 and closes switch S2 to enable current to flow out of C1 and ramps up the actual tuning voltage ($V_t$).

If $V_t$ is determined 422 to be low, the processor/logic circuit 101 opens 428 switch S3 and closes switch S2, as shown in FIG. 6, to enable current to flow out of 440 C1 and ramps up 442 the tuning voltage $V_t$. The processor/logic circuit 101 continues to compare 418 the tuning voltage $V_t$ to ($V_m+V_o$) and to ($V_m-V_o$).

FIGS. 4-6 illustrate the operation of the steering current circuit 118 based on the comparison of the actual tuning voltage 112 ($V_t$) and the desired tuning voltage ($V_m$) stored in the memory 202 plus or minus the offset voltage ($V_m+V_o$) and ($V_m-V_o$) stored in the offset memory 304. An oscillator 310 feeds a reference signal $F_{out}$ to the frequency reference input ($\text{Ref}_{in}$) to the PLL circuit 122. The RF input of the PLL circuit 122 ($\text{RF}_{in}$) receives the output frequency 123 ($f_o$) of the VCO 308. The PLL circuit 122 provides the output signal 121 ($f_{ref}$) output in the form of a pulse width modulated waveform at the reference frequency ($f_{ref}$) is fed to the input of the loop filter 320 via the switch S3. The steering current circuit 118 charges or discharges capacitor $C_1$ of the loop filter to steer up or steer down the actual tuning voltage ($V_t$).

FIG. 4 illustrates the signal generator 300 when the actual tuning voltage 112 ($V_t$) is within the "window" bounded by ($V_m+V_o$) and ($V_m-V_o$). In this state, the comparator circuit 306 opens 424 switches S1 and S2 and closes 426 switch S3 as shown in and continues to monitor 402 the PLL circuit 122 lock detect until the PLL circuit 122 lock detect indicates that the PLL circuit 122 is unlocked.

FIG. 5 illustrates the signal generator 300 when the actual tuning voltage ($V_t$) is high and the processor/logic circuit 101 opens switch S3 and closes switch S1 to enable current to flow into C1 and ramps down the actual tuning voltage ($V_t$).

FIG. 6 illustrates the signal generator 300 when the actual tuning voltage ($V_t$) is low and the processor/logic circuit 101 opens switch S3 and closes switch S2 to enable current to flow out of C1 and ramps up the actual tuning voltage ($V_t$).

As used throughout this disclosure and in particular with reference to FIGS. 1-3, a processor/logic circuit 101 for controlling the signal generator 100, 300 may comprise one or more processor circuits or processing units, one or more memory circuits and/or storage circuit component(s) and one or more input/output (I/O) circuit devices. Additionally, the processor/logic circuit 101 comprises a bus that allows the various circuit components and devices to communicate with one another. The bus represents one or more of any of several types of bus structures, including a memory bus or memory controller using any of a variety of bus architectures. The bus may comprise wired and/or wireless buses.

The processor/logic circuit 101 may be responsible for executing various software programs such as system programs, applications programs, and/or modules to provide computing and processing operations. The processor/logic 101 may be responsible for performing various data communications operations transmitting and receiving data information over one or more wired or wireless communications channels. The processor/logic circuit 101 may include any suitable processor architecture and/or any suitable number of processors in accordance with this disclosure. In one aspect, the processor/logic circuit 101 may be implemented using a single integrated processor.

The processor/logic circuit 101 may be implemented as a host central processing unit (CPU) using any suitable processor circuit or logic device (circuit), such as a as a general purpose processor and/or a state machine. The processor/logic circuit 101 also may be implemented as a chip multiprocessor (CMP), dedicated processor, embedded processor, media processor, input/output (I/O) processor, co-processor, microprocessor, controller, microcontroller, application specific integrated circuit (ASIC), field programmable gate array (FPGA), programmable logic device (PLD), or other processing device in accordance with the described embodiments.

In various aspects, the processor/logic may be implemented as a microcontroller comprising one or more processors (e.g., microprocessor, microcontroller) coupled to at least one memory 202. The memory 202 stores machine executable instructions that when executed by the processor/logic circuit 101, cause the processor/logic circuit 101 to execute machine instructions to implement various processes described herein. The processor/logic circuit 101 may be any one of a number of single or multi-core processors known in the art. The memory 202 may comprise volatile and non-volatile storage media. The processor/logic circuit 101 may include an instruction processing unit and an arithmetic unit. The instruction processing unit may be configured to receive instructions from the memory 202 of this disclosure.

The processor/logic circuit 101 may be implemented using combinational logic circuits. The combinational logic circuits can be configured to implement various processes described herein. The processor/logic circuit 101 may comprise a finite state machine comprising a combinational logic circuit configured to receive data, process the data, and provide an output of the signal generator 100, 200, 300.

The processor/logic circuit 101 may comprise a sequential logic circuit configured to control aspects of the signal generator 100, 200, 300. The sequential logic circuit or the combinational logic circuit can be configured to implement various processes described herein. The sequential logic circuit may comprise a finite state machine. The sequential logic circuit may comprise a combinational logic circuit, at least one memory circuit, and a clock, for example. The at least one memory circuit can store a current state of the finite state machine. In certain instances, the sequential logic circuit may be synchronous or asynchronous. The combinational logic circuit is configured to receive data associated with the surgical instrument or tool from an input, process the data, and provide an output of the signal generator 100, 200, 300. In other aspects, the circuit may comprise a combination of a processor and a finite state machine to implement various processes herein. In other aspects, the finite state machine may comprise a combination of a combinational logic circuit and a sequential logic circuit.

As shown, the processor/logic circuit 101 may be coupled to the memory 202 and/or storage component(s) through a memory bus. The memory bus may comprise any suitable interface and/or bus architecture for allowing the processor/logic circuit 101 to access the memory 202 and/or storage component(s). Although the memory 202 and/or storage component(s) may be shown as being separate from the processor/logic circuit 101 for purposes of illustration, it is worthy to note that in various aspects some portion or the entire memory 202 and/or storage component(s) may be included on the same integrated circuit as the processor/logic circuit 101. Alternatively, some portion or the entire memory 202 and/or storage component(s) may be disposed on an integrated circuit or other medium (e.g., hard disk drive) external to the integrated circuit of the processor/logic circuit 101.

The memory 202 and/or storage component(s) represent one or more computer-readable media. The memory 202 and/or storage component(s) may be implemented using any computer-readable media capable of storing data such as volatile or non-volatile memory, removable or non-removable memory, erasable or non-erasable memory, writeable or re-writeable memory, and so forth. The memory 202 and/or storage component(s) may comprise volatile media (e.g., random access memory (RAM)) and/or nonvolatile media (e.g., read only memory (ROM), Flash memory, optical disks, magnetic disks and the like). The memory 202 and/or storage component(s) may comprise fixed media (e.g., RAM, ROM, a fixed hard drive, etc.) as well as removable media (e.g., a Flash memory drive, a removable hard drive, an optical disk, etc.). Examples of computer-readable storage media may include, without limitation, RAM, dynamic RAM (DRAM), Double-Data-Rate DRAM (DDRAM), synchronous DRAM (SDRAM), static RAM (SRAM), read-only memory (ROM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory, ovonic memory, ferroelectric memory, silicon-oxide-nitride-oxide-silicon (SONOS) memory, magnetic or optical cards, or any other type of media suitable for storing information.

While various details have been set forth in the foregoing description, it will be appreciated that the various aspects of the techniques for operating a frequency synthesizer may be practiced without these specific details. One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Further, while several forms have been illustrated and described, it is not the intention of the applicant to restrict or limit the scope of the appended claims to such detail. Numerous modifications, variations, changes, substitutions, combinations, and equivalents to those forms may be implemented and will occur to those skilled in the art without departing from the scope of the present disclosure. Moreover, the structure of each element associated with the described forms can be alternatively described as a means for providing the function performed by the element. Also, where materials are disclosed for certain components, other materials may be used. It is therefore to be understood that the foregoing description and the appended claims are intended to cover all such modifications, combinations, and variations as falling within the scope of the disclosed forms. The appended claims are intended to cover all such modifications, variations, changes, substitutions, modifications, and equivalents.

For conciseness and clarity of disclosure, selected aspects of the foregoing disclosure have been shown in block diagram form rather than in detail. Some portions of the detailed descriptions provided herein may be presented in terms of instructions that operate on data that is stored in one or more computer memories or one or more data storage devices. Such descriptions and representations are used by those skilled in the art to describe and convey the substance of their work to others skilled in the art. In general, an algorithm refers to a self-consistent sequence of steps leading to a desired result, where a "step" refers to a manipulation of physical quantities and/or logic states which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities and/or states.

Unless specifically stated otherwise as apparent from the foregoing disclosure, it is appreciated that, throughout the foregoing disclosure, discussions using terms such as "processing" or "computing" or "calculating" or "determining" or "displaying" or the like, refer to the action and processes of a computer system, or similar electronic computing device, that manipulates and transforms data represented as physical (electronic) quantities within the processor system's registers and memories into other data similarly represented as physical quantities within the processor system memories or registers or other such information storage, transmission or display devices.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose processing device configured by an executable computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

The foregoing detailed description has set forth various forms of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, and/or examples can be implemented, individually and/or collectively, by a wide range of hardware, software, firmware, or virtually any combination thereof. In one form, several portions of the subject matter described herein may be implemented via an application specific integrated circuit (ASIC), a field programmable gate array (FPGA), a digital signal processor (DSP), or other integrated formats. However, those skilled in the art will recognize that some aspects of the forms disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as one or more program products in a variety of forms, and that an illustrative form of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In some instances, one or more elements may be described using the expression "coupled" and "connected" along with their derivatives. It should be understood that these terms are not intended as synonyms for each other. For example, some aspects may be described using the term "connected" to indicate that two or more elements are in direct physical or electrical contact with each other. In another example, some aspects may be described using the term "coupled" to indicate that two or more elements are in direct physical or electrical contact. The term "coupled," however, also may mean that two or more elements are not in direct contact with each other and yet still co-operate or interact with each other. It is to be understood that depicted architectures of different components contained within, or connected with, different other components are merely examples, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated also can be viewed as being "operably connected," or "operably coupled," to each other to achieve the desired functionality, and any two components capable of being so associated also can be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components, and/or electrically interacting components, and/or electrically interactable components, and/or optically interacting components, and/or optically interactable components.

In other instances, one or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

While particular aspects of the present disclosure have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "one form," or "a form" means that a particular feature, structure, or characteristic described in connection with the aspect is included in at least one aspect. Thus, appearances of the phrases "in one aspect," "in an aspect," "in one form," or "in a form" in various places throughout the specification are not necessarily all referring to the same aspect. Furthermore, the particular features, structures or characteristics may be combined in any suitable manner in one or more aspects.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The following references are incorporated herein by reference: Phase Locked Loops Principles and Practice, Paul V. Brennan, McGraw Hill 1996; U.S. Pat. No. 3,755,758 to D. Leeson; Frequency Synthesis, Jerzy Gorski-Popiel, John Wiley & Sons 1975; Frequency Synthesizers Theory and Design, Vadim Manassewitsch, John Wiley & Sons 1980; Phaselock Techniques, Floyd Gardner, John Wiley & Sons 1966; Operational Amplifiers, G. Clayton & S. Winder Newnes 2000; YIG Resonators and Filters, J. Helszian, John Wiley & Sons 1985. All of the above-mentioned U.S. patents, U.S. patent application publications, U.S. patent applications, foreign patents, foreign patent applications, non-patent publications referred to in this specification and/or listed in any Application Data Sheet, or any other disclosure material are incorporated herein by reference, to the extent not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

Various aspects of the subject matter described herein are set out in the following numbered examples:

Example 1

A signal generator, comprising of the tuning voltage and the offset voltage ($V_m-V_o$); a comparator circuit coupled to the adder and the subtractor circuits, the comparator circuit configured to receive a digitized voltage controlled oscillator tuning voltage ($V_t$) and to compare the digitized voltage controlled oscillator (VCO) tuning voltage ($V_t$) to the sum of the tuning voltage and the offset voltage ($V_m+V_o$) and the difference of the tuning voltage and the offset voltage ($V_m-V_o$) and to produce a window bounded by ($V_m+V_o$) and ($V_m-V_o$), the comparator circuit further configured to generate control signals; and a steering current circuit coupled to the comparator circuit to receive the control signals from the comparator circuit and to control a steering current based on the control signals.

Example 2

The signal generator of Example 1, wherein the comparator circuit is configured to compute three logical decisions as follows: a first logical decision given by $A=V_t\geq(V_m+V_o)$; a second logical decision given by $B=V_t\leq(V_m-V_o)$; and a third logical decision given by $C=(V_m-V_o)\leq V_t\leq(V_m+V_o)$.

Example 3

The signal generator of Example 2, wherein: a true outcome of the first logical decision causes the comparator circuit to output a first control signal to the steering current circuit to steer the steering current in a first direction; a true outcome of the second logical decision causes the comparator circuit to output a second control signal to the steering current circuit to steer the steering current in a second direction opposite the first direction; and a true outcome of the third logical decision causes the comparator circuit to output a third control signal to the steering current circuit to disable the steering current.

Example 4

The signal generator of any one of Example 1-3, wherein the steering current circuit comprises a first electronic switch S1 controlled by the first control signal, a second electronic switch S2 controlled by the second control signal, and a third electronic switch S3 controlled by the third control signal.

Example 5

The signal generator of any one of Examples 1-4, further comprising: a phase-locked loop (PLL) circuit coupled to the comparator circuit and the steering current circuit, wherein the PLL circuit comprises a loop filter comprising a loop filter capacitor; wherein the true outcome of the first logical decision causes the comparator circuit to output the first control signal to the steering current circuit to charge the loop filter capacitor with the steering current; and wherein the true outcome of the second logical decision causes the comparator circuit to output the second control signal to the steering current circuit to discharge the loop filter capacitor with the steering current.

Example 6

The signal generator of any one of Examples 1-5, further comprising a PLL control circuit coupled to the PLL circuit, the PLL control circuit comprising a phase comparator/detector coupled to the third electronic switch, the phase comparator/detector configured to output a reference frequency signal; wherein true outcome of the third logical decision causes the comparator circuit to output a third control signal to the steering current circuit to couple the reference frequency signal to the loop filter.

Example 7

The signal generator of any one of Examples 1-6 further comprising an analog-to-digital converter (ADC) coupled to the comparator circuit and to the loop filter, wherein the ADC is configured to: receive an analog VCO tuning voltage from the loop filter; convert the analog VCO tuning voltage to the digitized VCO tuning voltage ($V_t$); and provide the digitized VCO tuning voltage ($V_t$) to the comparator circuit; wherein the comparator circuit is configured to utilize the digitized VCO tuning voltage ($V_t$) to compute the three logical decisions.

Example 8

The signal generator of any one of Examples 1-7, wherein the tuning voltage ($V_m$) values and the offset voltage ($V_o$) values stored in the memory are paged by temperature.

Example 9

A method of generating a signal, the method comprising: receiving, by a processor/logic, a request to output a new frequency; generating, by a phase-lock-loop (PLL) circuit, a new analog tuning voltage corresponding to the new frequency; loading, by the processor/logic into a comparator, a new digital tuning voltage ($V_t$); loading, by the processor/logic from a memory into an adder/subtractor circuit, a new tuning voltage ($V_m$) corresponding to the value of the new frequency; loading, by the processor/logic from the memory into the adder/subtractor circuit, a new offset voltage ($V_o$); computing, by the comparator, logical mathematical decisions based on the new digital tuning voltage ($V_t$), the new tuning voltage ($V_m$), and the new offset voltage ($V_o$); controlling, by a steering current circuit coupled to the comparator, a steering current into or out of the PLL circuit; and generating, by the PLL circuit, a tuning voltage based on the steering current.

Example 10

The method of Example 9, further comprising: loading, by the processor/logic, a frequency control word corresponding to the new frequency into the PLL circuit; and converting, by an analog-to-digital converter (ADC), the new analog tuning voltage to a new digital tuning voltage ($V_t$).

Example 11

The method of any one of Examples 9-10, further comprising: comparing, by the comparator, the new digital tuning voltage ($V_t$) to the sum of the new tuning voltage ($V_m$) and the new offset voltage ($V_o$); and comparing, by the comparator, the new digital tuning voltage ($V_t$) to the difference of the new tuning voltage ($V_m$) and the new offset voltage ($V_o$).

Example 12

The method of anyone of Examples 9-11, further comprising: determining, by the comparator, that the new digital tuning voltage ($V_t$) is greater than or equal to the sum of the new tuning voltage ($V_m$) and the new offset voltage ($V_o$); controlling, by the steering current circuit, the steering current into the PLL circuit; and ramping down, by the PLL circuit, the analog tuning voltage.

Example 13

The method of any one of Examples 9-12, further comprising: determining, by the comparator, that the new digital tuning voltage ($V_t$) is less than or equal to the difference of the new tuning voltage ($V_m$) and the new offset voltage ($V_o$); controlling, by the steering current circuit, the steering current out of the PLL circuit; and ramping up, by the PLL circuit, the analog tuning voltage.

Example 14

The method of any one of Examples 9-13, further comprising: determining, by the comparator, that the new digital tuning voltage ($V_t$) is greater than or equal to the difference of the new tuning voltage ($V_m$) and the new offset voltage ($V_o$) and is less than or equal to the sum of the new tuning voltage ($V_m$) and the new offset voltage ($V_o$); and disabling, by the steering current circuit, the steering current from flowing into or out of the PLL circuit.

Example 15

The method of any one of Examples 9-14, wherein the memory comprises a tuning voltage memory to store tuning voltage and an offset voltage memory to store offset voltage.

Example 16

A signal generator, comprising: a processor/logic; a memory coupled to the processor/logic, the memory stores digital tuning voltage and offset voltage values; an adder/subtractor circuit coupled to the memory; a comparator coupled to the adder/subtractor circuit; a steering current circuit coupled to the comparator; and a phase-lock-loop (PLL) circuit coupled to the memory and the steering current circuit, the PLL circuit further comprising: a programmable counter; a loop filter comprising a loop filter capacitor, a loop filter coupled to the steering current circuit; a phase comparator/detector circuit; and a voltage controlled oscillator (VCO); wherein the processor/logic is configured to: receive a request to output a new frequency; generate, by a phase-lock-loop (PLL) circuit, a new analog tuning voltage corresponding to the new frequency; load into the comparator a new digital tuning voltage ($V_t$); load from a memory into an adder/subtractor circuit, a new tuning voltage ($V_m$) corresponding to the value of the new frequency; load from the memory into the adder/subtractor circuit a new offset voltage ($V_o$); wherein the comparator is configured to compute logical mathematical decisions based on the new digital tuning voltage ($V_t$), the new tuning voltage ($V_m$), and the new offset voltage ($V_o$); wherein the steering current circuit is configured to control steering current into or out of the PLL circuit; and wherein the PLL circuit is configured to generate a tuning voltage based on the steering current.

Example 17

The signal generator of Example 16, further comprising an analog-to-digital converter (ADC); wherein the processor/logic is configured to load a frequency control word corresponding to the new frequency into the PLL circuit; and wherein the ADC is configured to convert the new analog tuning voltage to a new digital tuning voltage ($V_t$).

Example 18

The signal generator of any one of Examples 16-17, wherein the comparator is configured to: compare the new digital tuning voltage ($V_t$) to the sum of the new tuning voltage ($V_m$) and the new offset voltage ($V_o$); and compare the new digital tuning voltage ($V_t$) to the difference of the new tuning voltage ($V_m$) and the new offset voltage ($V_o$).

Example 19

The signal generator of any one of Examples 16-18, wherein the comparator is configured to determine that the new digital tuning voltage ($V_t$) is greater than or equal to the sum of the new tuning voltage ($V_m$) and the new offset voltage ($V_o$); wherein the steering current circuit is configured to control the steering current into the PLL circuit; and wherein the PLL circuit is configured to ramp down the analog tuning voltage.

Example 20

The signal generator of any one of Examples 16-18, further comprising: wherein the comparator is configured to determine that the new digital tuning voltage ($V_t$) is less than or equal to the difference of the new tuning voltage ($V_m$) and the new offset voltage ($V_o$); wherein the steering current circuit is configured to control the steering current out of the PLL circuit; and wherein the PLL circuit is configured to ramp up the analog tuning voltage.

Example 21

The signal generator of any one of Examples 16-18, further comprising: wherein the comparator is configured to determine that the new digital tuning voltage ($V_t$) is greater than or equal to the difference of the new tuning voltage ($V_m$) and the new offset voltage ($V_o$) and is less than or equal to the sum of the new tuning voltage ($V_m$) and the new offset voltage ($V_o$); and wherein the steering current circuit is configured to disable the steering current from flowing into or out of the PLL circuit.

The invention claimed is:

1. A signal generator, comprising:
a memory to store tuning voltage ($V_m$) values and offset voltage ($V_o$) values;
an adder circuit coupled to the memory, the adder circuit to produce a sum of a tuning voltage and an offset voltage ($V_m+V_o$);
a subtractor circuit coupled to the memory, the subtractor circuit to produce a difference of the tuning voltage and the offset voltage ($V_m-V_o$);
a comparator circuit coupled to the adder and the subtractor circuits, the comparator circuit configured to receive a digitized voltage controlled oscillator tuning voltage ($V_t$) and to compare the digitized voltage controlled oscillator (VCO) tuning voltage ($V_t$) to the sum of the tuning voltage and the offset voltage ($V_m+V_o$) and the difference of the tuning voltage and the offset voltage ($V_m-V_o$) and to produce a window bounded by ($V_m+V_o$) and ($V_m-V_o$), the comparator circuit further configured to generate control signals; and
a steering current circuit coupled to the comparator circuit to receive the control signals from the comparator circuit and to control a steering current based on the control signals.

2. The signal generator of claim 1, wherein the comparator circuit is configured to compute three logical decisions as follows:
a first logical decision given by $A=V_t \geq (V_m+V_o)$;
a second logical decision given by $B=V_t \leq (V_m-V_o)$; and
a third logical decision given by $C=(V_m-V_o) \leq V_t \leq (V_m+V_o)$.

3. The signal generator of claim 2, wherein:
a true outcome of the first logical decision causes the comparator circuit to output a first control signal to the steering current circuit to steer the steering current in a first direction;
a true outcome of the second logical decision causes the comparator circuit to output a second control signal to the steering current circuit to steer the steering current in a second direction opposite the first direction; and
a true outcome of the third logical decision causes the comparator circuit to output a third control signal to the steering current circuit to disable the steering current.

4. The signal generator of claim 3, wherein the steering current circuit comprises a first electronic switch S1 controlled by the first control signal, a second electronic switch S2 controlled by the second control signal, and a third electronic switch S3 controlled by the third control signal.

5. The signal generator of claim 3, further comprising:
a phase-locked loop (PLL) circuit coupled to the comparator circuit and the steering current circuit, wherein the PLL circuit comprises a loop filter comprising a loop filter capacitor;
wherein the true outcome of the first logical decision causes the comparator circuit to output the first control signal to the steering current circuit to charge the loop filter capacitor with the steering current; and
wherein the true outcome of the second logical decision causes the comparator circuit to output the second control signal to the steering current circuit to discharge the loop filter capacitor with the steering current.

6. The signal generator of claim 5, further comprising a PLL control circuit coupled to the PLL circuit, the PLL control circuit comprising a phase comparator/detector coupled to the third electronic switch, the phase comparator/detector configured to output a reference frequency signal;
wherein true outcome of the third logical decision causes the comparator circuit to output a third control signal to the steering current circuit to couple the reference frequency signal to the loop filter.

7. The signal generator of claim 5, further comprising an analog-to-digital converter (ADC) coupled to the comparator circuit and to the loop filter, wherein the ADC is configured to:
receive an analog VCO tuning voltage from the loop filter;
convert the analog VCO tuning voltage to the digitized VCO tuning voltage ($V_t$); and
provide the digitized VCO tuning voltage ($V_t$) to the comparator circuit;
wherein the comparator circuit is configured to utilize the digitized VCO tuning voltage ($V_t$) to compute the three logical decisions.

8. The signal generator of claim 1, wherein the tuning voltage ($V_m$) values and the offset voltage ($V_o$) values stored in the memory are paged by temperature.

9. A method of generating a signal, the method comprising:
receiving, by a processor/logic, a request to output a new frequency;
generating, by a phase-lock-loop (PLL) circuit, a new analog tuning voltage corresponding to the new frequency;
loading, by the processor/logic into a comparator, a new digital tuning voltage ($V_t$);
loading, by the processor/logic from a memory into an adder/subtractor circuit, a new tuning voltage ($V_m$) corresponding to the value of the new frequency;
loading, by the processor/logic from the memory into the adder/subtractor circuit, a new offset voltage ($V_o$);
computing, by the comparator, logical mathematical decisions based on the new digital tuning voltage ($V_t$), the new tuning voltage ($V_m$), and the new offset voltage ($V_o$);
controlling, by a steering current circuit coupled to the comparator, a steering current into or out of the PLL circuit; and
generating, by the PLL circuit, a tuning voltage based on the steering current.

10. The method of claim 9, further comprising:
loading, by the processor/logic, a frequency control word corresponding to the new frequency into the PLL circuit; and
converting, by an analog-to-digital converter (ADC), the new analog tuning voltage to a new digital tuning voltage ($V_t$).

11. The method of claim 9, further comprising:
comparing, by the comparator, the new digital tuning voltage ($V_t$) to the sum of the new tuning voltage ($V_m$) and the new offset voltage ($V_o$); and
comparing, by the comparator, the new digital tuning voltage ($V_t$) to the difference of the new tuning voltage ($V_m$) and the new offset voltage ($V_o$).

12. The method of claim 11, further comprising:
determining, by the comparator, that the new digital tuning voltage ($V_t$) is greater than or equal to the sum of the new tuning voltage ($V_m$) and the new offset voltage ($V_o$);
controlling, by the steering current circuit, the steering current into the PLL circuit; and
ramping down, by the PLL circuit, the analog tuning voltage.

13. The method of claim 11, further comprising:
   determining, by the comparator, that the new digital tuning voltage ($V_t$) is less than or equal to the difference of the new tuning voltage ($V_m$) and the new offset voltage ($V_o$);
   controlling, by the steering current circuit, the steering current out of the PLL circuit; and
   ramping up, by the PLL circuit, the analog tuning voltage.

14. The method of claim 11, further comprising:
   determining, by the comparator, that the new digital tuning voltage ($V_t$) is greater than or equal to the difference of the new tuning voltage ($V_m$) and the new offset voltage ($V_o$) and is less than or equal to the sum of the new tuning voltage ($V_m$) and the new offset voltage ($V_o$); and
   disabling, by the steering current circuit, the steering current from flowing into or out of the PLL circuit.

15. The method of claim 9, wherein the memory comprises a tuning voltage memory to store tuning voltage and an offset voltage memory to store offset voltage.

16. A signal generator, comprising:
   a processor/logic;
   a memory coupled to the processor/logic, the memory stores digital tuning voltage and offset voltage values;
   an adder/subtractor circuit coupled to the memory;
   a comparator coupled to the adder/subtractor circuit;
   a steering current circuit coupled to the comparator; and
   a phase-lock-loop (PLL) circuit coupled to the memory and the steering current circuit, the PLL circuit further comprising:
      a programmable counter;
      a loop filter comprising a loop filter capacitor, a loop filter coupled to the steering current circuit;
      a phase comparator/detector circuit; and
      a voltage controlled oscillator (VCO);
   wherein the processor/logic is configured to:
      receive a request to output a new frequency;
      generate, by a phase-lock-loop (PLL) circuit, a new analog tuning voltage corresponding to the new frequency;
      load into the comparator a new digital tuning voltage ($V_t$);
      load from a memory into an adder/subtractor circuit, a new tuning voltage ($V_m$) corresponding to the value of the new frequency;
      load from the memory into the adder/subtractor circuit a new offset voltage ($V_o$);
   wherein the comparator is configured to compute logical mathematical decisions based on the new digital tuning voltage ($V_t$), the new tuning voltage ($V_m$), and the new offset voltage ($V_o$);
   wherein the steering current circuit is configured to control steering current into or out of the PLL circuit; and
   wherein the PLL circuit is configured to generate a tuning voltage based on the steering current.

17. The signal generator of claim 16, further comprising an analog-to-digital converter (ADC);
   wherein the processor/logic is configured to load a frequency control word corresponding to the new frequency into the PLL circuit; and
   wherein the ADC is configured to convert the new analog tuning voltage to a new digital tuning voltage ($V_t$).

18. The signal generator of claim 16, wherein the comparator is configured to:
   compare the new digital tuning voltage ($V_t$) to the sum of the new tuning voltage ($V_m$) and the new offset voltage ($V_o$); and
   compare the new digital tuning voltage ($V_t$) to the difference of the new tuning voltage ($V_m$) and the new offset voltage ($V_o$).

19. The signal generator of claim 18,
   wherein the comparator is configured to determine that the new digital tuning voltage ($V_t$) is greater than or equal to the sum of the new tuning voltage ($V_m$) and the new offset voltage ($V_o$);
   wherein the steering current circuit is configured to control the steering current into the PLL circuit; and
   wherein the PLL circuit is configured to ramp down the analog tuning voltage.

20. The signal generator of claim 18, further comprising:
   wherein the comparator is configured to determine that the new digital tuning voltage ($V_t$) is less than or equal to the difference of the new tuning voltage ($V_m$) and the new offset voltage ($V_o$);
   wherein the steering current circuit is configured to control the steering current out of the PLL circuit; and
   wherein the PLL circuit is configured to ramp up the analog tuning voltage.

21. The signal generator of claim 18, further comprising:
   wherein the comparator is configured to determine that the new digital tuning voltage ($V_t$) is greater than or equal to the difference of the new tuning voltage ($V_m$) and the new offset voltage ($V_o$) and is less than or equal to the sum of the new tuning voltage ($V_m$) and the new offset voltage ($V_o$); and
   wherein the steering current circuit is configured to disable the steering current from flowing into or out of the PLL circuit.

* * * * *